(12) United States Patent
Teng

(10) Patent No.: US 6,495,310 B2
(45) Date of Patent: *Dec. 17, 2002

(54) LITHOGRAPHIC PLATE HAVING CONFORMAL OVERCOAT AND PHOTOSENSITIVE LAYER ON A ROUGH SUBSTRATE

(76) Inventor: Gary Ganghui Teng, 10 Kendall Dr., Nothborough, MA (US) 01532

( * ) Notice: Subject to any disclaimer, the term of this patent is extended or adjusted under 35 U.S.C. 154(b) by 0 days.

This patent is subject to a terminal disclaimer.

(21) Appl. No.: 10/046,789

(22) Filed: Jan. 15, 2002

(65) Prior Publication Data

US 2002/0098447 A1 Jul. 25, 2002

Related U.S. Application Data

(63) Continuation-in-part of application No. 09/699,784, filed on Oct. 30, 2000, now Pat. No. 6,387,595, and a continuation-in-part of application No. 09/873,598, filed on Jun. 4, 2001.

(51) Int. Cl.⁷ .............................. G03F 7/24; G03F 7/30; B41N 3/08
(52) U.S. Cl. ................. 430/303; 430/302; 430/944; 430/945; 430/271.1; 101/450.1; 101/451; 101/463.1
(58) Field of Search ................... 430/303, 302; 101/451, 450.1, 463.1

(56) References Cited

U.S. PATENT DOCUMENTS

| | | | |
|---|---|---|---|
| 3,458,311 A | 7/1969 | Alles et al. | 96/35.1 |
| 5,258,263 A | 11/1993 | Cheema et al. | 430/309 |
| 5,516,620 A | 5/1996 | Cheng et al. | 430/138 |
| 5,561,029 A | 10/1996 | Fitzgerald et al. | 430/281.1 |
| 5,599,650 A | 2/1997 | Bi et al. | 430/273.1 |
| 5,616,449 A | 4/1997 | Cheng et al. | 430/302 |
| 5,677,110 A | 10/1997 | Chia et al. | 430/302 |
| 5,705,309 A | 1/1998 | West et al. | 430/167 |
| 6,014,929 A | 1/2000 | Teng | 101/456 |
| 6,030,751 A | 2/2000 | Ellis et al. | 430/302 |
| 6,071,675 A | 6/2000 | Teng | 430/302 |
| 6,153,356 A | 11/2000 | Urano et al. | 430/281.1 |
| 6,232,038 B1 | 5/2001 | Takasaki et al. | 430/281.1 |
| 6,242,156 B1 | 6/2001 | Teng | 430/271.1 |
| 6,387,595 B1 * | 5/2002 | Teng | 430/302 |

* cited by examiner

Primary Examiner—Cynthia Hamilton

(57) ABSTRACT

The present invention provides a lithographic printing plate comprising on a roughened substrate a substantially conformal photosensitive layer and a substantially conformal overcoat. The photosensitive layer is substantially conformally coated on the roughened substrate surface and the overcoat is substantially conformally coated on the photosensitive layer surface so that the surface of the overcoat has peaks and valleys substantially corresponding to the major peaks and valleys of the substrate microscopic surface. The lithographic plate of such a configuration can provide no or low tackiness and excellent block resistance, while allowing excellent press durability. For on-press developable lithographic plate, such a plate configuration also allows excellent on-press developability.

20 Claims, 1 Drawing Sheet

LITHOGRAPHIC PLATE HAVING CONFORMAL OVERCOAT AND PHOTOSENSITIVE LAYER ON A ROUGH SUBSTRATE

RELATED PATENT APPLICATIONS

This application is a continuation in-part of my U.S. patent application Ser. No. 09/699,784 filed Oct. 30, 2000, now U.S. Pat. No. 6,324,595 and 09/873,598 filed Jun. 4, 2001.

FIELD OF THE INVENTION

This invention relates to lithographic printing plates. More particularly, it relates to lithographic plates having on a roughened substrate a substantially conformally coated photosensitive layer and a substantially conformally coated overcoat.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation. In positive-working systems, the exposed areas become more soluble and can be developed to reveal the underneath substrate. In negative-working systems, the exposed areas become hardened and the non-exposed areas can be developed to reveal the underneath substrate. Conventionally, the actinic radiation is from a lamp (usually an ultraviolet lamp) and the image pattern is generally determined by a photomask that is placed between the light source and the plate. With the advance of laser and computer technologies, laser sources have been increasingly used to directly expose a printing plate according to digital imaging information.

Currently, most commercial lithographic plates require a development process after the plates being exposed and before put on press. A liquid developer is used to dissolve and clean off the non-exposed areas (for negative plate) or the exposed areas (for positive plate). Such a development process is time and labor consuming and generates wet waste. It would be desirable that such a tedious development process can be eliminated.

On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the on-press developable lithographic printing plates are U.S. Pat. Nos. 5,258,263, 5,407,764, 5,516,620, 5,561,029, 5,616,449, 5,677,110, 5,811,220, and 6,014,929.

Lithographic plates having a photo-insensitive overcoat on the photosensitive layer have been disclosed in the patent literature, including U.S. Pat. Nos. 5,677,110, 5,599,650, 5,677,108, and 5,997,993. The overcoat is introduced to, for example, reduce physical damage or contamination to the photosensitive layer during handling, improve photospeed, curing efficiency, and curing consistence by reducing oxygen inhibition (for free radical polymerizable photosensitive layer), improve humidity stability, and/or improve on-press developability (for on-press developable plate).

The photosensitive layer is generally coated onto a smooth or grained substrate at sufficient thickness to form a flat, smooth surface. For plates with an overcoat, the overcoat is generally coated to form a flat, smooth surface. While plates with a flat, smooth surface are very useful, they often suffer from the problem that the photosensitive layer surface tends to block to the back of another plate at extreme environmental condition, such as high temperature, high pressure, and high humidity. Also, such a plate can suffer from tackiness or fingerprinting when the photosensitive layer or the overcoat is a semisolid material, is formulated with higher content of liquid components, or is moisture sensitive (at higher humidity). Therefore, there is a desire for a lithographic plate that has excellent block resistance, non-tackiness, and fingerprinting resistance, in addition to on-press developability (for on-press developable plate) and press durability.

I have found that a lithographic plate comprising on a roughened substrate a substantially conformally coated photosensitive layer and a substantially conformally coated overcoat can provide no or low tackiness and excellent block resistance, while allowing excellent press durability. For on-press developable lithographic plate, such a photosensitive layer configuration also allows excellent on-press developability. The photosensitive layer is substantially conformally coated on the roughened substrate surface and the overcoat is substantially conformally coated on the photosensitive layer in a way so that the surface of the overcoat has peaks and valleys substantially corresponding to the major peaks and valleys of the substrate microscopic surface. It is very surprising that such a plate surface gives very low tackiness and excellent block resistance even with a semisolid photosensitive layer and/or semisolid overcoat which is very tacky and has poor block resistance when coated to form a smooth surface.

SUMMARY OF THE INVENTION

It is an object of the present invention to provide a lithographic printing plate with no or low tackiness and good block resistance while maintaining excellent press performance.

It is another object of the present invention to provide a lithographic plate having a semisolid photosensitive layer and/or overcoat with no or low tackiness and good block resistance.

It is another object of the present invention to provide a lithographic plate comprising on a roughened substrate a substantially conformally coated photosensitive layer and a substantially conformally coated overcoat in order to achieve reduced tackiness or good block resistance, while allowing excellent press durability.

It is another object of the present invention to provide an on-press developable lithographic plate having on a roughened substrate a conformal photosensitive layer and a conformal overcoat.

Further objects, features and advantages of the present invention will become apparent from the detailed description of the preferred embodiments.

According to the present invention, there has been provided a lithographic printing plate, comprising in order:
 (a) a substrate with roughened surface comprising, at least, peaks and valleys;
 (b) a photosensitive layer capable of hardening or solubilization upon exposure to an actinic radiation and exhibiting an affinity or aversion substantially opposite to the affinity or aversion of said substrate to at least one printing liquid selected from the group consisting of ink and an abhesive fluid for ink; and
 (c) an overcoat;
 (d) wherein said photosensitive layer is substantially conformally coated on the substrate surface and said overcoat is substantially conformally coated on the photosensitive layer surface, so that the surface of said overcoat has peaks and valleys substantially corresponding to the major peaks and valleys of the substrate microscopic surface.

According to another aspect of the present invention, there has been provided a method of lithographically printing images on a receiving medium, comprising in order:
 (a) providing a lithographic printing plate comprising: (i) a substrate with roughened surface comprising, at least, peaks and valleys; (ii) a photosensitive layer capable of hardening or solubilization upon exposure to an actinic radiation and exhibiting an affinity or aversion substantially opposite to the affinity or aversion of said substrate to at least one printing liquid selected from the group consisting of ink and an abhesive fluid for ink, the non-hardened or solubilized areas of said photosensitive layer being soluble or dispersible in ink (for waterless plate) or in ink and/or fountain solution (for wet plate); and (iii) an ink and/or fountain solution soluble or dispersible overcoat; wherein said photosensitive layer is substantially conformally coated on the substrate surface and said overcoat is substantially conformally coated on the photosensitive layer surface, so that the surface of said overcoat has peaks and valleys substantially corresponding to the major peaks and valleys of the substrate microscopic surface;
 (b) imagewise exposing the plate with an actinic radiation to cause hardening or solubilization of the exposed areas; and
 (c) contacting said exposed plate with ink (for waterless plate), or with ink and/or fountain solution (for wet plate) on a printing press to remove the overcoat and the non-hardened or solubilized areas of the photosensitive layer, and to lithographically print images from said plate to the receiving medium.

The plate can be sensitive to an ultraviolet, visible, or infrared radiation. It can be exposed with an actinic radiation through a photomask or by direct exposure according to digital imaging information. For direct exposure, a laser (including infrared, visible or ultraviolet laser) is a preferred radiation source.

For on-press developable plate, the plate can be imaged off press and then mounted on press for on-press development with ink and/or fountain solution and lithographic printing. Alternatively, the plate can be imagewise exposed with a laser while mounted on a plate cylinder of a lithographic press, on-press developed on the same plate cylinder with ink and/or fountain solution, and then directly print images to the receiving sheets.

DETAILED DESCRIPTION OF THE PREFERRED EMBODIMENTS

Figure 1:
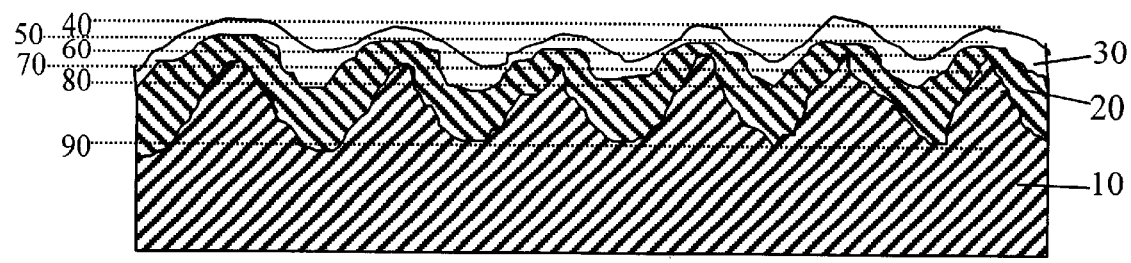
FIG. 1 is a diagrammatic cross-sectional view of a lithographic printing plate of the invention. The plate comprises a substrate with roughened surface (10) having, at least, peaks and valleys, a photosensitive layer (20) which is substantially conformally coated on the roughened substrate surface, and an overcoat (30) which is substantially conformally coated on the photosensitive layer surface. The surface of the overcoat has peaks and valleys substantially corresponding to the major peaks and valleys of the substrate microscopic surface.

The present invention provides lithographic printing plates (FIG. 1) comprising a roughened substrate having, at least, peaks and valleys (10), a thin photosensitive layer (20) which is substantially conformally coated on the roughened substrate surface, and a thin photo-insensitive overcoat (30) which is substantially conformally coated on the photosensitive layer surface, so that the surface of the overcoat has peaks and valleys substantially corresponding to the major peaks and valleys of the substrate microscopic surface. The photosensitive layer is capable of hardening or solubilization upon exposure to an actinic radiation. The photosensitive layer or overcoat can be a solid or semisolid material. For on-press developable plate, both the photosensitive layer and the overcoat are soluble or dispersible in ink and/or fountain solution.

As shown in FIG. 1, the substrate microscopic surface is substantially fully covered by the photosensitive layer and the overcoat, and the overcoat surface has raised microscopic peaks and lower microscopic valleys. In a preferred configuration, the average height of the valleys on the overcoat surface (60) is at least 0.1 microns below the average height of the peaks of the overcoat surface (40). In another preferred configuration (not shown here), the average height of the valleys on the overcoat surface (60) is below the average height of the peaks on the substrate surface (70).

Lithographic printing plates having a photosensitive layer substantially conformally coated on a roughened substrate are described in U.S. Pat. No. 6,242,156, the entire disclosure of which is hereby incorporated by reference. In the current invention, a thin photo-insensitive overcoat is further substantially conformally coated on the photosensitive layer.

The photosensitive layer should exhibit an affinity or aversion substantially opposite to the affinity or aversion of the substrate to at least one printing liquid selected from the group consisting of ink and an abhesive fluid for ink. An abhesive fluid for ink is a fluid that repels ink. Fountain solution is the most commonly used abhesive fluid for ink. A wet plate is printed on a wet press equipped with both ink and fountain solution, while a waterless plate is printed on a waterless press equipped with ink.

Lithographic printing plate constructions covered in this invention include, but are not limited to, (a) a wet plate with a hydrophilic substrate and an oleophilic photosensitive layer; (b) a wet plate with an oleophilic substrate and a hydrophilic photosensitive layer; (c) a waterless plate with an oleophilic substrate and an oleophobic photosensitive layer; and (d) a waterless plate with an oleophobic substrate and an oleophilic photosensitive layer. A preferred wet plate comprises a hydrophilic substrate and an oleophilic photosensitive layer. A preferred waterless plate comprises an oleophilic substrate and an oleophobic photosensitive layer. The photosensitive layer or the overcoat can be a single layer, or can consist of more than one sublayers of different compositions. For example, the photosensitive layer can consist of two photosensitive sublayers as described in U.S. Pat. No. 5,476,754, and the overcoat can consist of two overcoats of different compositions.

For plates with rough and/or porous hydrophilic surface capable of mechanical interlocking with a coating deposited thereon, a thin releasable (such as water-soluble) interlayer as described in U.S. Pat. No. 6,014,929, the entire disclosure of which is hereby incorporated by reference, may be deposited between the substrate and the photosensitive layer, wherein the substrate surface is rough and/or porous enough and the interlayer is thin enough to allow bonding between the photosensitive layer and the substrate through mechanical interlocking.

For on-press developable plate of this invention, both the photosensitive layer and the overcoat are soluble or dispersible in ink and/or fountain solution.

The substrate employed in the lithographic plates of this invention can be any lithographic substrate with roughened surface. Here the roughened surface is defined as a surface having microscopic, non-smooth structures on the whole surface (for the roughened side). Such microscopic structures include, regular or irregular, peaks and valleys, pores, and holes. Such a support may be a metal sheet, a polymer film, or a coated paper. The substrate can be roughened on only one side or on both sides; accordingly, the photosensitive layer and overcoat can be coated on only one side to form single-sided lithographic plate or on both sides to form double-sided lithographic plate.

Roughened aluminum (including aluminum alloys) sheets are preferred metal supports. Particularly preferred is an aluminum support that has been grained, anodized, and deposited with a barrier layer. Surface roughening can be achieved by mechanical graining or brushing, chemical etching, and/or electrochemical graining. The roughened surface can be further anodized to form a durable aluminum oxide surface using an acid electrolyte such as sulfuric acid and/or phosphoric acid. For wet lithographic plate with hydrophilic substrate, the roughened and anodized aluminum surface can be further thermally or electrochemically coated with a layer of silicate or hydrophilic polymer such as polyvinyl phosphonic acid, polyacrylamide, polyacrylic acid, polybasic organic acid, and copolymers of vinyl phosphonic acid and acrylamide to form a durable hydrophilic layer. Processes for coating a hydrophilic barrier layer on aluminum in lithographic printing plate application are well known in the art, and examples can be found in U.S. Pat. Nos. 2,714,066, 4,153,461, 4,399,021, and 5,368,974. For waterless plate with oleophilic substrate, the anodized substrate can be directly used or can be further coated with an oleophilic sublayer.

Polyester sheet is the commonly used polymeric plate support. For wet lithographic plate with hydrophilic substrate, a hydrophilic sublayer is deposited on the substrate surface. For waterless lithographic plate with oleophilic substrate, the polyester substrate can be directly used or can be further coated with an oleophilic polymeric sublayer. The polyester substrate must have roughened surface in order to be useful for the current invention.

It is noted that, in order to be useful for preparing the lithographic plate of this invention, the barrier layer or sublayer coated substrate surface must have roughened structures. This barrier layer or sublayer is permanently attached to the support surface and forms the substrate surface of the processed plate.

The roughness of a surface can be expressed as average surface roughness Ra which is the average deviation of the "peaks" and "valleys" from the centerline and is also called arithmetical roughness average. The substrate preferably has an average surface roughness Ra of 0.2 to 2.0 microns, more preferably 0.3 to 1.0 microns, and most preferably 0.4 to 0.8 microns.

For preparing actinic light sensitive plates of the current invention, any photosensitive layer is suitable which is capable of hardening or solubilization upon exposure to a radiation in the infrared, visible or ultraviolet region. Here hardening means becoming insoluble in a developer (negative-working) and solubilization means becoming soluble in a developer (positive-working). For on-press developable plates, the developer can be ink and/or fountain solution. The radiation can be a conventional light, such as from a high-pressure mercury lamp, a xenon lamp, or a fluorescence lamp (usually requiring a mask), or can be a laser that directly images according to digital imaging information.

Photosensitive materials useful in negative-working wet plates of this invention include compositions comprising an acrylic monomer, a polymeric binder, and a photoinitiator as described in U.S. Pat. Nos. 5,407,764 and 4,772,538; polycondensation products of diazonium salts as described in U.S. Pat. Nos.3,679,416, 3,867,147 and 4,631,245; compositions comprising a polyfunctional vinyl ether or epoxy monomer, and a cationic photoinitiator as described in U.S. Pat. Nos. 4,593,052 and 4,624,912; dual layer light sensitive materials as described in U.S. Pat. No. 5,476,754; thermosensitive compositions comprising an ethylenically unsaturated monomer, a photosensitive initiator, and an infrared light absorbing dye as described in U.S. Pat. Nos. 6,153,356 and 6,232,038; and compositions sensitized to both ultraviolet and infrared radiations as described in U.S. Pat. No. 5,491,046.

Photosensitive materials useful in positive-working wet plates include diazo-oxide compounds such as benzoquinone diazides and naphthoquinone diazides as described in U.S. Pat. No. 4,141,733 and compositions comprising a photo acid generator and a polymer having acid labile groups as described in U.S. Pat. No. 5,395,734.

Photosensitive oleophobic materials useful in waterless plates include compositions comprising polymers having perfluoroalkyl groups and crosslinkable terminal groups as described in U.S. Pat. Nos. 4,074,009 and 5,370,906, compositions comprising polysiloxane and crosslinkable resins, as described in U.S. Pat. No. 4,259,905, and compositions comprising a diazonium salt and an abhesive acid or salt thereof as described in U.S. Pat. No. 3,997,349.

The mechanisms for the photohardening or photosolubilization of photosensitive materials may be different for different photosensitive materials and imaging radiation. In this patent, any radiation that can cause hardening or solubilization of a photosensitive material is defined as actinic radiation for that photosensitive material. Such a radiation can be a conventional light or a laser.

It is noted that, in this patent, the term monomer includes both monomer and oligomer, and the term (meth)acrylate includes both acrylate and methacrylate.

In a preferred embodiment as for negative-working wet lithographic printing plates of this invention, the photosensitive layer comprises a polymerizable ethylenically unsaturated monomer having at least one terminal ethylenic group, a photosensitive free-radical initiator (including sensitizer), and optionally a polymeric binder (with or without ethylenic functionality). Various other additives such as surfactant, dye or pigment, radiation exposure-indicating dye (such as leuco crystal violet, leucomalachite green, azobenzene, 4-phenylazodiphenylamine, and methylene blue dyes), and free-radical stabilizer (such as methoxyhydroquinone) can be added.

In a second preferred embodiment as for negative-working wet lithographic printing plates of this invention, the photosensitive layer comprises a polyfunctional vinyl ether or epoxy monomer, a cationic photoinitiator (including sensitizer), and optionally a polymeric binders. Various other additives such as colorants, stabilizers, exposure indicators, surfactants may be added.

For photosensitive layer sensitive to an infrared radiation (also called thermosensitive layer), infrared dye or pigment is usually added as sensitizer or light-to-heat converter. A thermosensitive plate may also be sensitive to an ultraviolet or visible light.

In a preferred embodiment as for negative-working thermosensitive wet plates of the invention, the thermosensitive layer comprises a polymerizable ethylenically unsaturated monomer having at least one terminal ethylenic group, a free-radical initiator capable of generating free radical in the presence of an infrared absorbing dye or pigment upon exposure to an infrared radiation, an infrared absorbing dye or pigment, and optionally a polymeric binder. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. It is noted that certain additives can significantly reduce the polymerization rate of a free radical polymerization system sensitized by an infrared absorbing dye and should be avoided or used at minimum.

In a second preferred embodiment as for negative-working thermosensitive wet plates of this invention, the thermosensitive layer comprises an epoxy or vinyl ether monomer having at least one epoxy or vinyl ether functional group, a Bronsted acid generator capable of generating free acid in the presence of an infrared absorbing dye or pigment upon exposure to an infrared radiation, an infrared absorbing dye or pigment, and optionally a polymeric binder. Other additives such as surfactant, dye or pigment, exposure-indicating dye (such as leuco crystal violet, azobenzene, 4-phenylazodiphenylamine, and methylene blue dyes), and acid quencher (usually an alkaline compound, such as tetrabutylammonium hydroxide or triethylamine) may be added.

Semisolid photosensitive materials as described in U.S. pat. appl. Ser. No. 09/873,598 and thermosensitive materials as described in U.S. pat. appl. Ser. Nos. 09/656,052, 09/699,784, 09/952,933, and 10/023,342 can be used for the photosensitive layer of this invention. The entire disclosures of U.S. pat. appl. Ser. Nos. 09/873,598, 09/656,052, 09/699,784, 09/952,933, and 10/023,342 are hereby incorporated by reference.

Suitable free-radical polymerizable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth)acrylate group. The (meth)acrylate monomers may also contain an acidic (such as carboxylic acid) or basic (such as amine) functionality.

Suitable free-radical initiators include, for example, the derivatives of acetophenone (such as 2,2-dimethoxy-2-phenylacetophenone, and 2-methyl-1-[4-(methylthio) phenyl]-2-morpholino propan-1-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyloxy)-phenyl) phenyliodonium hexafluoroantimonate, triarylsulfonium hexafluorophosphate, triarylsulfonium p-toluenesulfonate, (3-phenylpropan-2-onyl) triaryl phosphonium hexafluoroantimonate, and N-ethoxy(2-methyl)pyridinium hexafluorophosphate, and the onium salts as described in U.S. Pat. Nos. 5,955,238, 6,037,098, and 5,629,354); borate salts (such as tetrabutylammonium triphenyl (n-butyl) borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076,); haloalkyl substituted s-triazines (such as 2,4-bis (trichloromethyl)-6-(p-methoxy-styryl)-s-triazine, 2,4-bis (trichloromethyl)-6-(4-methoxy-naphth-1-yl)-s-triazine, 2,4-bis(trichloromethyl)-6-piperonyl-s-triazine, and 2,4-bis (trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354); and titanocene (bis($\eta^9$-2,4-cyclopentadien-1-yl) bis[2,6-difluoro-3-(1H-pyrrol-1-yl)phenyl) titanium). The initiator is added in the photosensitive layer (including thermosensitive layer) preferably at 0.1 to 40% by weight of the photosensitive layer, more preferably at 0.4 to 20%, and most preferably at 1 to 10%.

Suitable polyfunctional epoxy monomers include, for example, 3,4-epoxycyclohexylmethyl-3,4-epoxycyclohexane carboxylate, bis-(3,4-epoxycyclohexymethyl) adipate, difunctional bisphenol A/epichlorohydrin epoxy resin and multifunctional epichlorohydrin/ tetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

Infrared absorbers useful in the thermosensitive layer of this invention include any infrared absorbing dye or pigment effectively absorbing an infrared radiation having a wavelength of 700 to 1,500 nm. It is preferable that the dye or pigment having an absorption maximum between the wavelengths of 750 and 1,200 nm. Various infrared absorbing dyes or pigments are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. Examples of useful infrared absorbing pigments include black pigments, metal powder pigments, phthalocyanine pigments, and carbon black. Carbon black is a preferred infrared absorbing pigment. Mixtures of dyes, pigments, or both can also be used. Infrared absorbing dye is preferred over infrared absorbing pigment because the infrared absorbing dye usually has higher absorbing efficiency, gives less visible color, and allows molecular level charge or energy transfer to activate the initiator. The infrared dye or pigment is added in the thermosensitive layer preferably at 0.01 to 30% by weight of the thermosensitive layer, more preferably at 0.1 to 20%, and most preferably at 0.5 to 10%.

Suitable polymeric binders for the photosensitive layers of this invention include, for example, polystyrene, (meth) acrylic polymers and copolymers (such as polybutylmethacrylate, polyethylmethacrylate, polymethylmethacrylate, polymethylacrylate, and butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehyde, butadiene/acrylonitrile copolymer, and polyurethane binder. Also useful are aqueous alkaline soluble polymers, such as (meth)acrylic polymer with substantial number of carboxylic acid functional groups, polymer with substantial number of phenol groups, and polymer with (meth)acrylate groups and carboxylate salt groups as described in U.S. Pat. No. 5,849,462. For oleophilic photosensitive layers, preferred polymeric binders are aqueous alkaline-insoluble oleophilic polymers. The polymers may or may not have polymerizable functional groups (such as ethylenic group, epoxy group, or vinyl ether group).

A particulate dispersion may be added into the photosensitive layer to enhance, for example, the developability and non-tackiness of the plate, as described in U.S. Pat. No. 6,071,675, the entire disclosure of which is hereby incorporated by reference.

In order to be useful for the on-press developable plate of this invention, the photosensitive layer must be capable of hardening or solubilization upon exposure to an actinic radiation, and the non-hardened (for negative-working plate) or solubilized (for positive-working plate) areas of the photosensitive layer must be soluble or dispersible in ink and/or fountain solution and can be developed off on a lithographic press with ink and/or fountain solution. Various on-press developable photosensitive layers have been disclosed in the patent literature and can be used for preparing the on-press developable plate of this invention. Patents describing on-press developable photosensitive layer include, for example, U.S. Pat. Nos. 5,516,620, 5,677,108, 5,776,654, 5,811,220, 5,997,993, 6,014,929, 6,071,675, and 6,027,857.

For on-press developable plate, various surfactants may be added into the photosensitive layer to allow or enhance the on-press ink and/or fountain solution developability. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 15%.

The photosensitive layer should have a coverage thin enough to allow formation of substantially conformal coating on the rough substrate surface but thick enough to allow sufficient durability. The photosensitive layer preferably has a coverage of 0.1 to 2.0 $g/m^2$, more preferably 0.3 to 1.5 $g/m^2$, and most preferably 0.5 to 1.0 $g/m^2$.

The photo-insensitive overcoat can be prepared from any film-forming material that is soluble or dispersible in a developer suitable for the photosensitive layer and is substantially transparent to the actinic radiation. For on-press developable plate, the developer is ink and/or fountain solution. The overcoat preferably comprises a polymeric binder. Alkaline or water soluble polymers are preferred binders for alkaline developable plate. Various additives, such as surfactant, wetting agent, defoamer, leveling agent, and dispersing agent, can be added into the overcoat formulation to facilitate, for example, the coating or development process. Various organic or inorganic emulsion or dispersion may be added into the overcoat to, for example, reduce the tackiness or moisture sensitivity of the plate.

For on-press developable plate, the overcoat is soluble or dispersible in ink and/or fountain solution. For wet plate, the overcoat preferably comprises a water-soluble polymer, such as polyvinyl alcohol (including various water-soluble derivatives of polyvinyl alcohol). Various additives as for conventional plate can be added. Various nonionic surfactants and ionic surfactants can be added to facilitate coating process and on-press developability. Examples of surfactants useful in the overcoat of this invention include polyethylene glycol, polypropylene glycol, and copolymer of ethylene glycol and propylene glycol, polysiloxane surfactants, perfluorocarbon surfactants, sodium dioctylsulfosuccinate, sodium dodecylbenzenesulfonate, and ammonium laurylsulfate. The surfactant can be added preferably at 0.01 to 40% by weight of the overcoat, more preferably at 0.2 to 15%.

The overcoat as well as the photosensitive layer compositions as described in U.S. patent application Ser. No. 09/699,784, the entire disclosure of which is hereby incorporated by reference, can be used for the lithographic plate of this invention.

The overcoat preferably has a coverage of from 0.001 to 1.0 $g/m^2$, more preferably from 0.002 to 0.50 $g/m^2$, and most preferably from 0.005 to 0.20 $g/m^2$.

On-press developable plate is usually exposed on an exposure device, and then mounted on press to develop with ink and/or fountain solution and then print out regular printed sheets. However, the plate can also be exposed on a printing press cylinder, and the exposed plate can be directly developed on press with ink and/or fountain solution and then print out regular printed sheets. For on-press development, good quality prints should be obtained preferably under 20 initial impressions, and more preferably under 5 impressions.

For conventional wet press, usually fountain solution is applied (to contact the plate) first, followed by contacting with ink roller. For press with integrated inking system, the ink and fountain solution are emulsified by the various press rollers before being transferred to the plate as emulsion of ink and fountain solution. However, in this invention, the ink and fountain solution may be applied at any combination or sequence, as needed for the plate. There is no particular limitation. The recently introduced single fluid ink, for example by Flink Ink Company, which can be used for printing wet lithographic plate without the use of fountain solution, can also be used for the on-press development and printing of the plate of this invention.

The invention is further illustrated by the following non-limiting examples of its practice.

EXAMPLE 1

An electrochemically roughened, anodized, and polyvinylphosphonic acid treated aluminum sheet with an Ra of about 0.6 microns was used as the plate substrate. The aluminum substrate was coated using a #6 Meyer rod with a photosensitive layer PS-1 to achieve a dry coverage of about 0.8 g/m$^2$, followed by drying in an oven at 80° C. for 5 min.

| PS-1 | |
|---|---|
| Component | Weight (g) |
| Neocryl B-728 (Polymer from Zeneca) | 2.494 |
| Ebecryl RX-8301 (Oligomer from UCB Chemicals) | 0.801 |
| Sartomer SR-399 (Monomer from Sartomer Company) | 5.488 |
| Irgacure 907 (Initiator from Ciba-Geigy) | 0.399 |
| Isopropyl thioxanthone (Sensitizer) | 0.200 |
| Methoxyether hydroquinone (Antioxidant) | 0.010 |
| Irganox 1035 (Antioxidant from Ciba-Geigy) | 0.010 |
| Orasol Blue GN (Blue dye from Ciba-Geigy) | 0.120 |
| Leuco crystal violet (Exposure indicator) | 0.080 |
| Pluronic L43 (Surfactant from BASF) | 0.399 |
| Methylethylketone | 90.000 |

The photosensitive layer coated substrate was further coated using a #6 Meyer rod with an overcoat formulation OC-1 to achieve a dry coverage of about 0.02 g/m$^2$, followed by drying in an oven at 80° C. for 5 min.

| OC-1 | |
|---|---|
| Component | Weight ratios |
| Airvol 205 (Polyvinyl alcohol from Air Products) | 0.2 |
| Dioctyl sulfosuccinate sodium salt (Surfactant) | 0.01 |
| Water | 99.8 |

A piece of the plate was examined under an optical microscope for the surface profiles. The plate surface showed microscopically roughened structures, with microscopic peaks and valleys. The blue-colored photosensitive layer substantially conformally covered the roughened substrate surface. Since the overcoat was coated quite uniformly and was very thin in coverage, it clearly formed a conformal coating over the photosensitive layer. Hand examination of the plate by gentle scratching with fingernails and rubbing with fingers also indicated rough surface profiles.

Another piece of the plate prepared above was evaluated by hand for tackiness. The plate was also tested for block resistance by stacking 4 pieces of the plate (4 inches by 4 inches) together with the coating side of the plate facing the back of the plate under a 10 pounds weight for 24 hours. This plate showed low tackiness, and good block resistance (no sticking together and no coating transfer to the back of another plate).

Another piece of the above plate (11 inches×18.5 inches) was exposed with an ultraviolet light exposure device (INSTANT 2 VACUUM PRINTER 24×28, from Berkey Technical Co., New York). The plate was placed under a negative photomask and exposed to an ultraviolet light with an emission maximum of about 364 nm under vacuum for 2 min. The exposed plate was directly mounted on the plate cylinder of a lithographic press (AB Dick 360) for on-press development. The press was started for 10 rotations (with the fountain roller on), and the ink roller (carrying emulsion of ink and fountain solution) was then applied to the plate cylinder to rotate for 10 rotations. The plate cylinder was then engaged with the blanket cylinder and printed with papers. The printed sheets showed good inking in exposed areas and clean background in non-exposed areas under 2 impressions. The plate continued to run for a total of 10,000 impressions without showing any wearing.

EXAMPLE 2 (Comparative Example for EXAMPLE 1)

The plate was prepared the same as in EXAMPLE 1 except that the substrate was a smooth aluminum sheet. The plate obtained was evaluated with the same procedures as in Example 1. Inspection of the plate indicated very flat and smooth surface. The plate showed high tackiness and poor block resistance.

EXAMPLE 3

In this example, the plate was prepared the same as in EXAMPLE 1 except that a mechanically roughened, anodized, and silicate treated aluminum substrate with Ra of about 0.5 microns was used.

The plate was evaluated with the same procedures as in Example 1. Inspection of the plate indicated microscopically roughened surface. The plate showed low tackiness, good block resistance, good on-press developability, and good durability.

EXAMPLE 4

An electrochemically grained, anodized, and silicate treated aluminum substrate with an Ra of about 0.6 microns was coated using a #6 Meyer rod with a photosensitive layer (also called thermosensitive layer in this case) formulation PS-2 to achieve a dry coverage of about 0.8 g/m$^2$, followed by drying in an oven at 80° C. for 5 min.

| PS-2 | |
|---|---|
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 1.00 |
| PINA FK-1151 (Infrared absorbing dye from Allied Signal) | 0.20 |
| Acetone | 90.2 |

The photosensitive layer coated plate was further coated with a water-soluble overcoat OC-2 using a #6 Meyer rod to achieve a dry coverage of about 0.2 g/m$^2$, followed by drying in an oven at 80° C. for 5 min.

| OC-2 | |
|---|---|
| Component | Weight ratios |
| Airvol 205 (Polyvinyl alcohol from Air Products) | 2.00 |
| Zonyl FSO (Perfluorinated surfactant from DuPont) | 0.02 |
| Water | 98.00 |

The plate was exposed with an infrared laser plate imager equipped with laser diodes emitting at about 830 nm (Trendsetter from CreoScitex). The plate was mounted on the imaging drum and exposed at a laser dosage of about 300 mJ/cm$^2$. The exposed areas showed yellow-brown imaging pattern, in contrast to the light green non-imaged areas.

The exposed plate was evaluated with the same procedures as in Example 1. Inspection of the plate indicated microscopically roughened surface. The plate showed low tackiness and good block resistance. For the press test, the plate rolled up quickly during on-press development; the printed sheets showed good inking in exposed areas and clean background in non-exposed areas under 10 impressions. The plate was printed on press for 500 impressions without showing any wearing (The press stopped at 500 impressions.).

EXAMPLE 5 (Comparative Example for EXAMPLE 4)

The plate was prepared the same as in EXAMPLE 4 except that the substrate was a smooth aluminum sheet. The plate obtained was evaluated with the same procedures as in Example 1. Inspection of the plate indicated very flat and smooth surface. The plate showed high tackiness and poor block resistance.

I claim:

1. A method of lithographically printing images on a receiving medium, comprising in order:
   (a) providing a lithographic printing plate comprising: (i) a substrate with roughened surface comprising, at least, peaks and valleys; (ii) a photosensitive layer capable of hardening or solubilization upon exposure to an actinic radiation and exhibiting an affinity or aversion substantially opposite to the affinity or aversion of said substrate to at least one printing liquid selected from the group consisting of ink and an abhesive fluid for ink, the non-hardened or solubilized areas of said photosensitive layer being soluble or dispersible in ink (for waterless plate) or in ink and/or fountain solution (for wet plate); and (iii) an ink and/or fountain solution soluble or dispersible overcoat; wherein said photosensitive layer is substantially conformally coated on the substrate surface and said overcoat is substantially conformally coated on the photosensitive layer surface, so that the surface of said overcoat has peaks and valleys substantially corresponding to the major peaks and valleys of the substrate microscopic surface and the average height of the valleys on the overcoat surface is at least 0.1 microns below the average height of the peaks of the overcoat surface;
   (b) imagewise exposing the plate with the actinic radiation to cause hardening or solubilization of the exposed areas; and
   (c) contacting said exposed plate with ink (for waterless plate), or with ink and/or fountain solution (for wet plate) on a printing press to remove the overcoat and the non-hardened or solubilized areas of the photosensitive layer, and to lithographically print images from said plate to the receiving medium.

2. The method of claim 1 wherein said substrate has an average surface roughness Ra of 0.2 to 1.5 microns, said photosensitive layer has a coverage of 0.2 to 1.5 g/m$^2$, and said overcoat has a coverage of 0.001 to 0.8 g/m$^2$.

3. The method of claim 1 wherein said substrate has an average surface roughness Ra of 0.4 to 1.0 microns, said photosensitive layer has a coverage of 0.4 to 1.2 g/m$^2$, and said overcoat has a coverage of 0.002 to 0.4 g/m$^2$.

4. The method of claim 1 wherein the average height of the valleys on the overcoat surface is at least 0.5 microns below the average height of the peaks of the overcoat surface.

5. The method of claim 1 wherein said plate is imagewise exposed with an actinic radiation while mounted on the plate cylinder of a lithographic press.

6. The method of claim 1 wherein said substrate is hydrophilic and said photosensitive layer is oleophilic, said overcoat and said photosensitive layer are soluble or dispersible in ink and/or fountain solution, and said plate is printed on a wet press.

7. The method of claim 1 wherein said substrate is oleophobic and said photosensitive layer is oleophilic, said overcoat and said photosensitive layer are soluble or dispersible in ink, and said plate is printed on a waterless press.

8. The method of claim 1 wherein said photosensitive layer comprises a free radical or cationic polymerizable monomer and an initiator capable of initiating the polymerization of said monomer; and is capable of harden upon exposure to an actinic radiation in ultraviolet, visible or infrared region.

9. The method of claim 1 wherein said photosensitive layer comprises a free radical or cationic polymerizable monomer, an initiator capable of initiating the polymerization of said monomer, and an infrared absorbing dye, and is capable of hardening upon exposure to an infrared radiation; and said plate is exposed with an infrared laser.

10. The method of claim 1 wherein said photosensitive layer is semisolid and is capable of hardening upon exposure to an actinic radiation.

11. The method of claim 1 wherein said plate further includes a releasable interlayer interposed between the substrate and the photosensitive layer, said releasable interlayer being soluble or dispersible in ink (for waterless plate) or in ink and/or fountain solution (for wet plate); wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the photosensitive layer and the substrate through mechanical interlocking.

12. A method of lithographically printing images on a receiving medium, comprising in order:
   (a) providing a negative lithographic printing plate comprising: (i) a hydrophilic substrate with roughened surface comprising, at least, peaks and valleys, (ii) an oleophilic semisolid photosensitive layer capable of hardening upon exposure to an actinic radiation and soluble or dispersible in ink and/or fountain solution, and (iii) a water soluble or dispersible overcoat; wherein said photosensitive layer is substantially conformally coated on the substrate surface and said overcoat is substantially conformally coated on the photosensitive layer surface, so that the surface of the overcoat has peaks and valleys substantially corresponding to the major peaks and valleys of the substrate microscopic surface and the average height of the valleys on the overcoat surface is at least 0.1 microns below the average height of the peaks of the overcoat surface;

(a) imagewise exposing the plate with the actinic radiation to cause hardening of the exposed areas; and (b) contacting said exposed plate with ink and fountain solution on a printing press to remove the overcoat and the non-hardened areas of the photosensitive layer, and to lithographically print images from said plate to the receiving medium.

13. The method of claim 12 wherein said substrate has an average surface roughness Ra of 0.2 to 1.5 microns, said photosensitive layer has a coverage of 0.2 to 1.5 g/m$^2$, and said overcoat has a coverage of 0.001 to 0.8 g/m$^2$.

14. The method of claim 12 wherein said substrate has an average surface roughness Ra of 0.4 to 1.0 microns, said photosensitive layer has a coverage of 0.4 to 1.2 g/m$^2$, and said overcoat has a coverage of 0.002 to 0.4 g/m$^2$.

15. The method of claim 14 wherein said photosensitive layer has a coverage of 0.4 to 1.0 g/m$^2$.

16. The method of claim 14 wherein said overcoat has a coverage of 0.005 to 0.2 g/m$^2$.

17. The lithographic plate of claim 12 wherein the average height of the valleys on the overcoat surface is at least 0.1 microns below the average height of the peaks of the substrate surface.

18. The method of claim 12 wherein said photosensitive layer comprises a free radical polymerizable ethylenically unsaturated monomer having at least one terminal ethylenic group, and a free-radical initiator, and is capable of hardening upon exposure to an ultraviolet or visible radiation; and said plate is exposed with an ultraviolet or visible radiaiton.

19. The method of claim 12 wherein said photosensitive layer comprises a free radical polymerizable ethylenically unsaturated monomer having at least one terminal ethylenic group, a free-radical initiator, and an infrared absorbing dye, and is capable of hardening upon exposure to an infrared radiation; and said plate is exposed with an infrared laser.

20. The method of claim 12 wherein said plate is imagewise exposed with an actinic laser while mounted on the plate cylinder of a lithographic press.

* * * * *